May 24, 1966 J. M. OSEPCHUK 3,253,230

CASCADED TRAVELING WAVE TUBES FOR PRODUCING A MULTIPLICITY OF FREQUENCY SIGNALS

Filed Jan. 30, 1963 3 Sheets-Sheet 1

INVENTOR
JOHN M. OSEPCHUK

BY Robert T. Dunn

AGENT

INVENTOR
JOHN M. OSEPCHUK
BY Robert T. Dunn
AGENT

May 24, 1966 J. M. OSEPCHUK 3,253,230

CASCADED TRAVELING WAVE TUBES FOR PRODUCING A MULTIPLICITY OF FREQUENCY SIGNALS

Filed Jan. 30, 1963 3 Sheets-Sheet 3

INVENTOR
JOHN M. OSEPCHUK
BY Robert T Dunn
AGENT

United States Patent Office 3,253,230
Patented May 24, 1966

3,253,230

CASCADED TRAVELING WAVE TUBES FOR PRODUCING A MULTIPLICITY OF FREQUENCY SIGNALS

John M. Osepchuk, Lexington, Mass., assignor to Raytheon Company, Lexington, Mass., a corporation of Delaware Filed Jan. 30, 1963, Ser. No. 255,004
5 Claims. (Cl. 331—82)

This invention relates to cascaded traveling wave tubes of the type including two or more separate wave conducting structures cooperating with the same electron beam, and more particularly to such a tube for producing two or more outputs of different frequency.

Heretofore, cascaded traveling wave tubes have included a backward wave oscillator section and an additional wave conducting structure such as a delay line for coupling the frequency generated by the oscillator to a utilization load. A cascaded traveling wave tube including a backward wave oscillator (BWO) section of this type is disclosed in copending application Serial No. 181,588, filed March 22, 1962, and now abandoned, to R. M. Unger, R. Harper and E. Scheffler. In operation the electron beam becomes modulated in the course of interaction in the backward wave oscillator section and thereafter couples with a second delay line which feeds a utilization load. Heretofore, the purpose of this second delay line has been to isolate the backward wave oscillator section from the load so that variations of load impedance would not cause the operating frequency of the oscillator to shift in a manner known commonly as frequency pulling. In such application, the delay line in the backard wave oscillator section and the second delay line have been designed for operation at the same frequency, and generally the second delay line operates in conjunction with the beam as a low gain backward wave amplifier. The second delay line operating in conjunction with the beam is inherently a low gain amplifier because of the backward mode interaction occurring therein. It cannot be designed for high gain because to do so would require an increase in beam starting current which would result in some operation as a backward wave oscillator rather than an amplifier.

The present invention contemplates a cascaded traveling wave tube including a single electron beam which interacts first with waves generated in a first delay line, the interaction being substantially in a backward mode, and thereafter the same beam interacts with waves conducted in at least one other delay line generating a different frequency therein than generated in the first delay line. Thus, the device produces a plurality of outputs of different frequencies which are sustained by interaction of different waves with the same electron beam.

In some embodiments of the present invention one of the output frequencies is a harmonic of the other, the fundamental of these being coupled from the first delay line and the harmonic being coupled from the second delay line. A variation of this embodiment includes a third delay line alongside the second. The fundamental frequency signal is generated in the second delay line, and the harmonic is generated in the third delay line, and both conduct waves which interact with the beam in a forward mode, thus both operate simultaneously as traveling wave amplifiers in conjunction with the same beam, and a separate load is coupled to the output of each, one load receiving fundamental and the other receiving harmonic.

In another embodiment of the invention, which also includes a backward wave oscillator section wherein the beam first interacts with waves generated in a first delay line, D.C. component remaining in the beam after this interaction is made use of. The remaining D.C. component in the beam interacts with waves generated in a second delay line in the manner of a backward wave oscillator. Thus, the device includes two separate backward wave oscillators, each interacting with the same electron beam, the second oscillator making use of the D.C. component remaining in the spent beam from the first backward wave oscillator section. In this embodiment the two backward wave oscillator sections may be designed for any selected frequencies, and the frequencies need not bear any predetermined relationship to each other. Furthermore, each backward wave oscillator section may be separately tuned over substantial frequency ranges. Other features of the invention will be more apparent from the following specific description taken in conjunction with the drawings in which:

Figure 1:
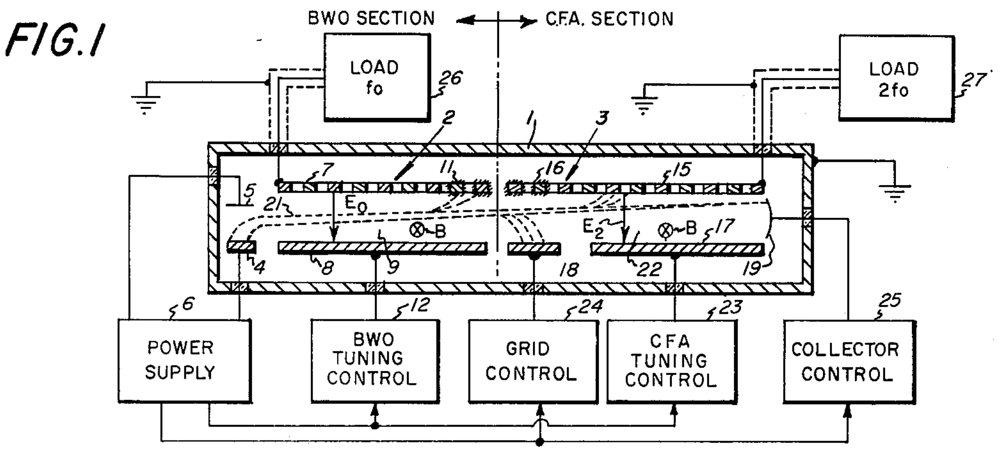
FIG. 1 represents a crossed-field type cascaded traveling wave tube including a backward wave oscillator section producing a fundamental frequency and a crossed-field amplifier section producing a harmonic thereof.
Figure 6:
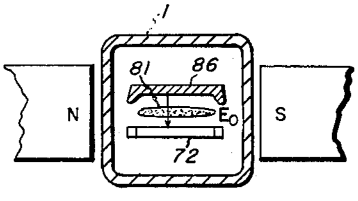
Figure 7:
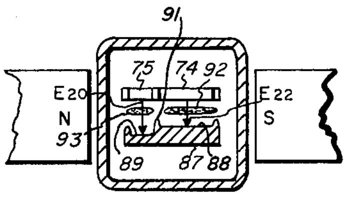
Figure 8:
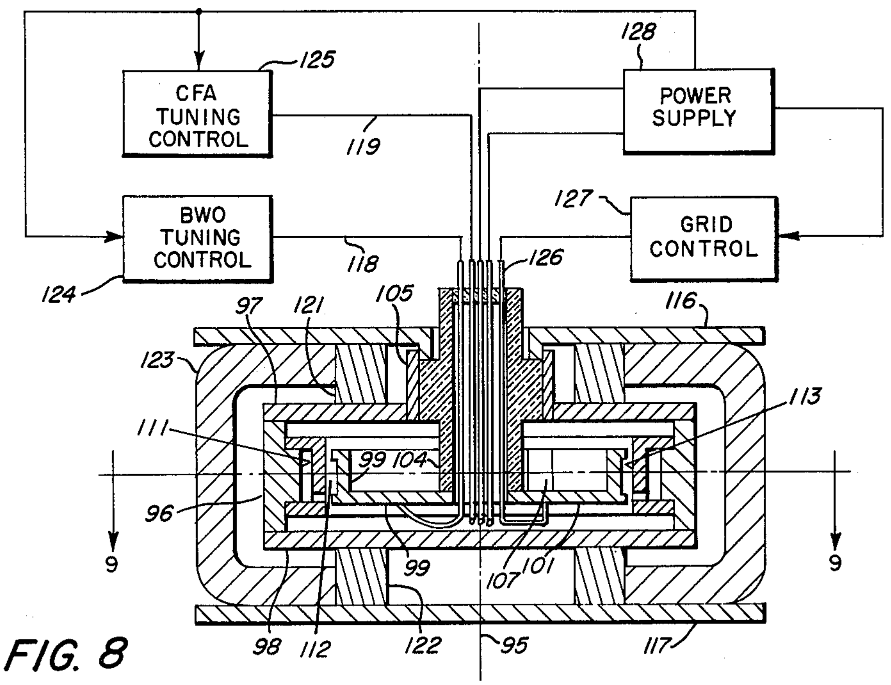
Figure 9:
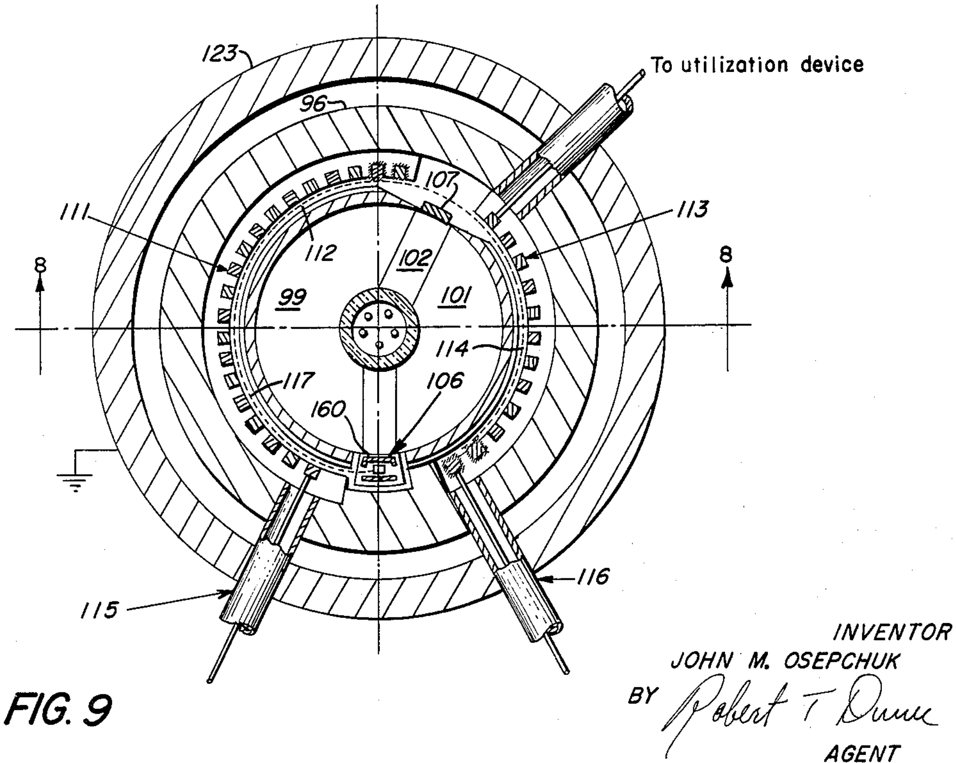

FIGS. 4–7 represent various views of another embodiment of the invention including a negative delay line backward wave oscillator section followed by two crossed-field amplifier (CFA) sections arranged side by side, one for amplifying fundamental signal, and the other for amplifying a harmonic of the fundamental imposed upon the beam; and FIGS. 8 and 9 show cross-section views of a crossed-field cascaded tube of the type shown in FIG. 1 and having a circular interaction space adjacent the delay lines.

Turning first to FIG. 1 there is shown an envelope 1 enclosing two traveling wave tube sections, a backward wave oscillator (BWO) section 2 operating at $f_0$ and a crossed-field amplifier (CFA) section 3 operating at $2f_0$. A cathode 4 and electron accelerator 5 are located at one end of the backard wave oscillator section and energized by a power supply 6. A delay line 7 and substantially smooth electrode 8 coextensive therewith extend the length of the backward wave oscillator section defining an interaction space 9 therebetween. The end of the delay line remote from the cathode is preferably terminated in a matched impedance which is accomplished by coating the remote end with wave absorbing material 11. Crossed electric and magnetic fields are produced in the interaction space and serve to compel electrons issuing from the cathode to move through the interaction space generating and exchanging energy with waves conducted by the delay line 7. For this purpose, the delay line 7 and the coextensive sole electrode 8 are energized at different D.C. potentials so that they bound the electric field $E_0$ in the interaction space, and a magnet is provided external to the envelope 1 for producing a magnetic field B directed generally into the page as represented by the circle with an X therein. Generally, it is preferred to ground the envelope and the delay line and to apply a relatively large negative potential to the sole electrode 8 and to vary this negative potential to thereby tune the backward wave oscillator section. For this purpose backward wave oscillator tuning control 12 is provided.

Crossed-field amplifier section 3 includes a delay line 15 matched at one end by coating 16, sole electrode 17 coextensive therewith and control and electron collecting electrodes 18 and 19 at opposite ends thereof. Control electrode 18 is preferably flush with the sole electrode 17 and serves to control the electron beam in passage through the transition section between the BWO section and CFA section. Collector 19, on the other hand, merely serves to collect whatever remaining beam electrons are not collected by delay line 15. In operation, electrons issuing from the cathode 4 are formed into a beam 21. The beam electrons generally move closer to the delay line 7 as they proceed from one end to the other of the BWO section. This is because the electrons give up energy to the wave generated in the delay line 7, and, as a result, they move away from the electrode 8 and toward the delay line which is at a more positive potential. In the transition region between sections 2 and 3, some degree of electron sorting occurs, and a certain portion of the electron beam flows to the control grid 18. The remainder of the beam continues through the CFA interaction space 22 which is bounded between delay line 15 and sole electrode 17. Interaction in CFA section 3 is in the forward mode, and the delay line 15 therein can be of minimum length because the beam upon entering section 3 is already modulated by the harmonic $2f_0$. As the electrons move through space 22 they give up energy to the waves and move closer to delay line 15, and a majority are collected thereon.

The CFA section 3 is preferably tuned by varying the negative potential applied to electrode 17, and for this purpose CFA tuning control 23 is provided. In addition, controls 24 and 25 are provided for controlling the potentials applied to electrodes 18 and 19, respectively.

As already mentioned, BWO section 2 operates at a fundamental frequency $f_0$, and CFA section 3 operates at a harmonic of $f_0$, for example, $2f_0$. Accordingly, two separate loads 26 and 27 are accommodated, load 26 making use of $f_0$, and load 27 making use of $2f_0$. Since load 27 is in no manner coupled to delay line 7, variations of its impedance will have no effect on $f_0$, and likewise, no effect on $2f_0$. As a result, the frequency applied to load 27 will be unaffected by impedance changes in load 27.

Figure 2:
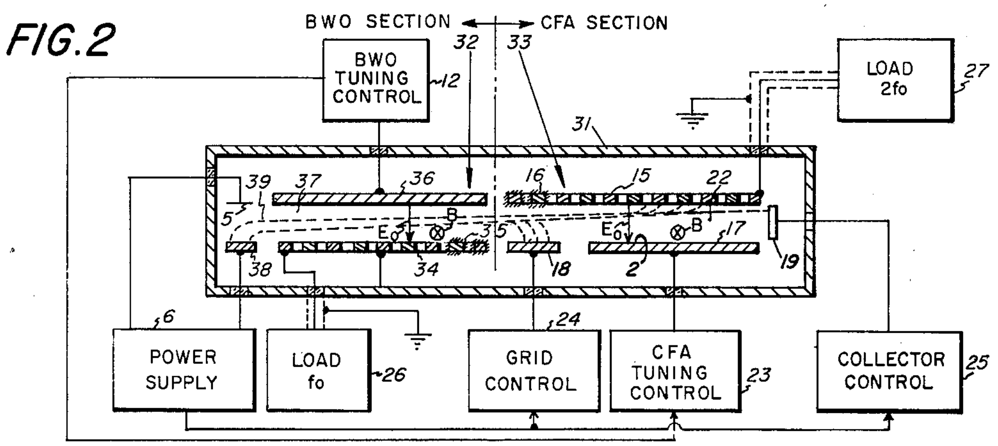
FIG. 2 represents a device similar to that represented by FIG. 1 but in which the delay line in the backward wave oscillator section is at a potential negative with respect to the elongated sole electrode coextensive therewith.

FIG. 2 illustrates another embodiment very similar to the one illustrated in FIG. 1. In FIG. 2 the envelope 31 encloses a BWO section 32 and a CFA section 33. Since the CFA section 33 is substantially identical to CFA section 3 described above in FIG. 1, it will not be further described. The BWO section 32, on the other hand, is somewhat different from BWO section 2 in that the delay line and sole electrode are reversed in position, and the delay line is at a negative D.C. potential with respect to the sole electrode. As shown in FIG. 2 the delay line 34 which is impedance matched at one end by resistive coating 35 and sole electrode 36 define an interaction space 37 and bound an electric field $E_0$ through which electrons from a cathode 38 move as a beam 39. As the electrons move through the interaction space 37 and give up energy to waves conducted by the delay line 34, they move closer to the sole electrode 36 because it is at the more positive D.C. potential. One advantage achieved by this is that none of the beam will be collected by delay line 34, and so practically the whole beam which courses through the backward wave oscillator section 32 will enter the crossed-field amplifier section 33.

Figure 3:
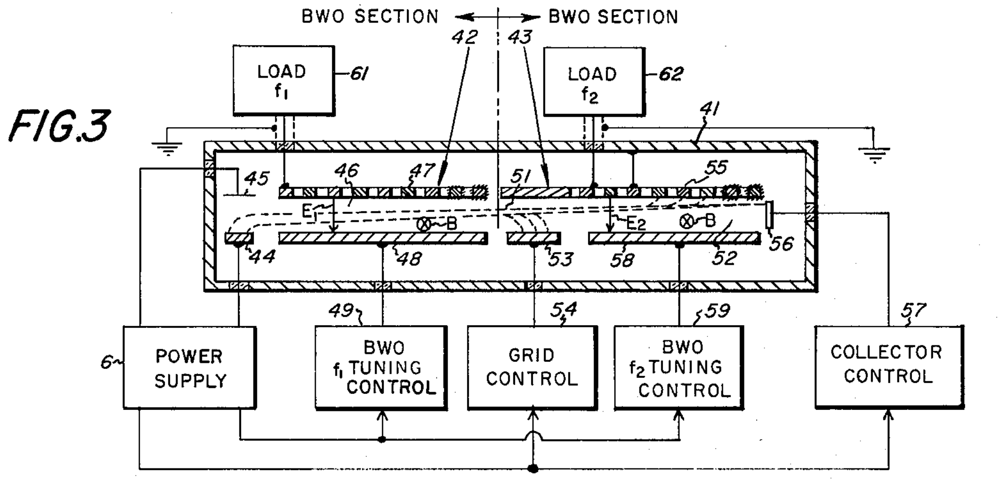
FIG. 3 represents an embodiment including two separate oscillator sections each producing a separate and independent frequency, the second section making use of the D.C. component remaining in the spent electron beam from the first section.

FIG. 3 illustrates an embodiment of the invention whereby two separate and independent output signals are generated. As shown, an envelope 41 encloses two backward wave oscillator sections 42 and 43. Section 42 includes a cathode 44, accelerating electrode 45 for launching electrons into interaction space 46 defined between delay line 47 and sole electrode 48 bounding the electric field $E_1$ which is controlled by $f_1$ tuning control 49. The spent beam 51 from section 42 enters the interaction space 52 of backward wave oscillator section 43 after coursing through a brief sorting region whereby some frequency components in the beam are eliminated by electron flow to control grid 53 energized from 54. The D.C. component in the spent beam exchanges energy with a backward mode of waves generated in delay line 55, and in the course of this interaction the beam electrons give up energy, and the majority are collected by delay line 55. The remaining part of the beam flows to collector 56 energized by control 57. The electric field $E_2$ in interaction space 52 is bound between delay line 55 and sole electrode 58 and is varied by tuning control 59.

In operation, separate loads 61 and 62 are coupled to the delay lines 47 and 55, respectively, and the frequencies applied to these loads are controlled by tuning controls 49 and 59, respectively. Since each of the frequencies $f_1$ and $f_2$ is generated and amplified in separate delay lines by interaction with D.C. components in the beam, any fluctuation of $f_1$ caused by variation of the impedance of load 61 (sometimes called frequency pulling), will not alter the frequency $f_2$ applied to the load 62 and vice versa. This is one advantage of the structure shown in FIG. 3 over that shown in FIGS. 1 and 2 where fluctuations of the load receiving the frequency $f_0$ would not only pull frequency $f_0$ but, would also pull the harmonic frequency $2f_0$.

Figure 4:
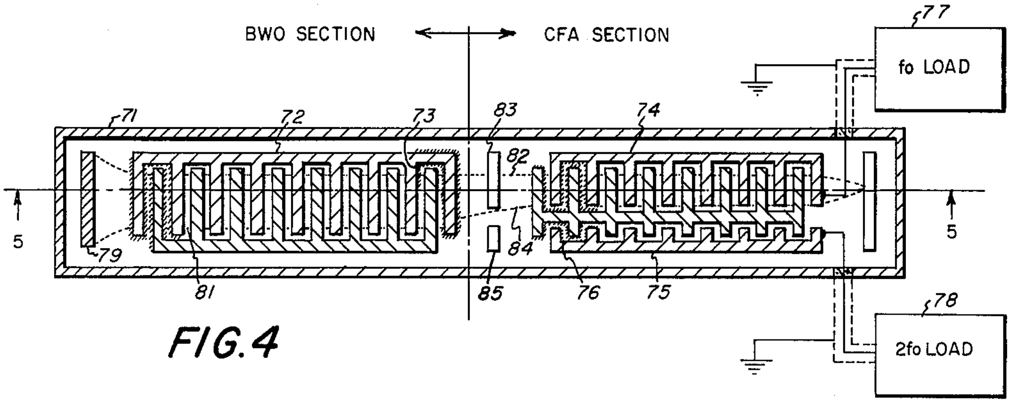
Figure 5:
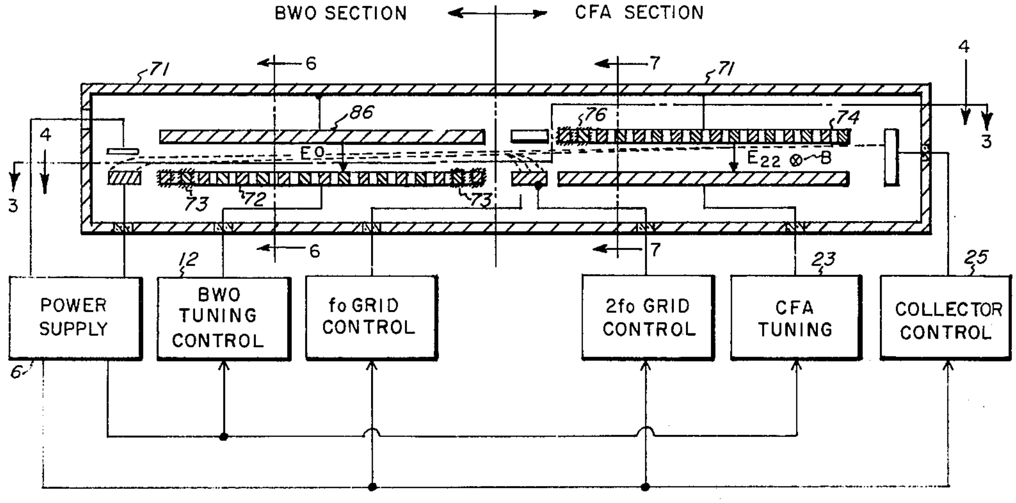

FIGS. 4–7 illustrate another embodiment of the invention similar to that already described with reference to FIG. 2, but, in addition, having the above-mentioned advantage that is gained by the structure in FIG. 3. That is, impedance fluctuations in either of the loads will not result in pulling frequency of signal applied to the other load. The structure in FIGS. 4–7 is similar to that in FIG. 2 in that two different types of sections are employed, and they are a negative delay line BWO section and the CFA section. The negative delay line is preferred in order to provide a strongly bunched or modulated beam issuing from the BWO section, as well as little net RF energy, dissipated in the BWO section delay line. Since the RF power flow in a negative delay line BWO is greatest toward the center of the line and least toward the ends, there is an efficient transfer of wave energy to the beam, and relatively little RF energy is dissipated in the line. Such is desirable where the BWO delay line does not couple RF energy to a load but serves only to modulate a beam. FIG. 4 is a transverse view to illustrate the three types of delay line structures enclosed by the envelope 71. The BWO section includes a negative delay line 72 which terminates at each end in matched impedances by virtue of attenuative coating 73. The crossed-field amplifier sections include two delay lines 74 and 75 arranged side by side each designed for operation at different frequencies which are harmonically related. For example, delay line 74 is designed for operation at $f_0$, whereas 75 is designed for operation at $2f_0$. Each of these delay lines is also terminated at one end in a matched impedance which is accomplished by coating the end with attenuative material 76. The other end of the delay lines 74 and 75 are coupled to loads 77 and 78, respectively.

In operation, electrons issuing from the cathode 79 form a broad flat beam 81 which moves adjacent the negative delay line 72 interacting with the backward mode of a wave conducted therein, and thus the beam is modulated. The modulated beam next enters the CFA sections, and one part 82 of the beam is accelerated or decelerated by control electrode 83, while another part 84 is accelerated or decelerated by electrode 85. Immediately thereafter the separate parts of the beam thus controlled move adjacent the delay lines 74 and 75, the part 82 of the beam interacting substantially only with waves conducted in delay line 74 and the other part 84 of the beam interacting substantially only with waves conducted in delay line 75.

FIGS. 6 and 7 are sectional views to illustrate the cross section of the beam in the BWO section and the cross section of the two parts into which the beam is split in the CFA sections. As shown in FIG. 6, the beam 81 lies between the delay line 72 and the relatively positive sole electrode 86, and has a substantially flat ribbon-like shape. The sole electrode 87 in the CFA sections includes two flat surfaces 88 and 89 facing the delay lines 74 and 75, respectively. These surfaces may be at different separations from their respective delay lines as is necessary to provide different electric field strengths $E_{20}$ and $E_{22}$ in their respective interaction spaces. A ridge 91 extends the length of the sole 87 and separates the two surfaces 88 and 89. The sole is constructed in this manner to effectively split the electron beam 81 into two beams 92 and 93 which are substantially parallel to each other, beam 92 exchanging energy principally with waves conducted in delay line 74, and beam 93 exchanging energy principally with waves conducted in delay line 75. In the embodiments shown in FIGS. 4–7, the beam is synchronized preferably with a forward wave mode, and thus the two sections perform as cross-field amplifiers. One advantage of the device shown in these figures is that two separate frequencies, one of which is a harmonic of the other, are supplied to loads 77 and 78, and the impedance of either of the loads may fluctuate without resulting in frequency pulling. Furthermore, the power output from the device to the loads may be varied by varying the gain in the CFA sections, and this will not result in frequency pushing because wave power generated in the BWO section would remain unaltered.

Another variation of the invention which is found convenient in practice includes arcuate sole electrodes, delay lines and interaction spaces. This makes possible a very uniform magnetic field B throughout the interaction spaces and also reduces over-all dimensions of the tube. FIGS. 8 and 9 illustrate sectional views of a cascaded tube similar in many respects to the tube shown in FIG. 1 and in which the delay lines and sole electrode are arcuate and define arcuate interaction spaces. FIG. 8 is substantially a figure of revolution about axis 95 except for certain parts which will be apparent from the description below. The envelope is formed of an anode cylinder 96 capped at upper and lower ends by plates 97 and 98. Within the envelope thus formed there is disposed two sole electrodes 99 and 101 which are insulated from each other and attached together by insulating strips 102 and 103 to form a substantially disc-shaped part suspended within the envelope at the end of a ceramic cylinder 104 which extends through an opening at the center of plate 97 and is sealed to this opening. More particularly, ceramic cylinder 104 seals to a Kovar sleeve 105 which in turn seals to the opening in plate 97. The ceramic cylinder 104 also serves to carry electric leads to an electron gun structure 106, to each of the sole sections 99 and 101 and to a control grid 107 which is insulatedly supported by attachment at the end of insulating strip 102 as shown.

The interaction regions in the tubes shown in FIGS. 8 and 9 are each opposite one of the sole electrodes 99 or 101 and are defined as the space between the electrode and an opposing delay line. Interdigital delay line 111 and sole electrode 99 define an interaction space 112 in which an electron beam from the cathode 106 interacts with a backward mode of waves conducted by delay line 111 to generate and sustain a frequency $f_0$. Thus, the delay line 111 and sole electrode 99 define a backward wave oscillator section. Another section is defined by delay line 113 and sole electrode 101 which bound interaction space 114. These cooperate with the spent electron beam from the BWO section to perform as a crossed-field amplifier (CFA), and while the BWO section operates at $f_0$, the CFA section operates at a harmonic of $f_0$, for example, $2f_0$. Thus, the output from delay line 111 obtained at coaxial coupling 115 is at $f_0$, while the output from delay line 113 obtained at coaxial coupling 116 is $2f_0$. Control grid 107 serves substantially the same purpose as the control grid 18 in FIG. 1.

In operation, the electrons issuing from the electron gun 106 are compelled by transverse electric and magnetic fields in the interaction spaces to follow a course substantially as indicated by the broken line 117. The transverse electric field is bounded between each of the sole electrodes and its corresponding delay line by virtue of the potentials applied to the sole electrodes through, for example, electric leads 118 and 119 which are carried by the ceramic support 104. The transverse magnetic field which is generally directed into or out of a page is bounded by pole pieces 121 and 122 which are substantially contiguous with the cover plates 97 and 98. These cylindrical pole pieces are in intimate contact with opposite poles of a substantially toroidal-shaped permanent magnet 123 which is fixed between upper and lower support plates 116 and 117 which are securely fastened together to hold the magnet, pole pieces and envelope in firm contact.

The leads 111 and 112 from the sole sections 94 and 95 couple to backward wave oscillator and crossed-field amplifier tuning controls 124 and 125. Lead 126 couples the control grid 102 to grid control 127, and power is supplied to the cathode from a power supply 128 through the remaining leads.

This completes descriptions of specific embodiments of the invention, all of which include separate delay line structures designed for operation at different frequencies, both conducting waves which gain energy from the same electron beam issuing from a single electron source with means coupling different frequency signals from each of the delay lines to separate loads and whereby frequency pushing and/or pulling of at least one of said signals is substantially avoided. The various embodiments all include crossed-field type traveling wave tubes. However, it is to be clearly understood that other types which do not employ crossed electric and magnetic fields could be substituted without deviating from the spirit and scope of the invention as set forth in the accompanying claims.

What is claimed is:

1. A traveling wave tube comprising:

a backward wave oscillator section generating waves of a first frequency and including at least a wave conducting structure for conducting waves of said first frequency and means for producing an electron beam for exchanging energy with said first frequency waves;

second and third wave conducting structures electrically insulated from said oscillator section;

means for producing crossed electric and magnetic fields for compelling electrons of the spent electron and magnetic fields electrons of the spent electron beam from said oscillator section to move adjacent said second and third structures generating waves of harmonically related frequencies therein;

control means for individually accelerating and decelerating the beam portions in each of said second and third structures;

and means coupling each of said harmonically related frequency waves from said tube to different utilization loads.

2. An electron discharge device comprising:

an envelope enclosing a plurality of wave conducting structures which are electrically insulated from each other and coextensive sole electrodes disposed opposite to each of said wave conducting structures to define therebetween an interaction space;

means for producing a beam of electrons;

means for producing crossed electric and magnetic fields for compelling said beam to move sequentially through said interaction spaces to generate and exchange energy with waves of a first frequency in one of said structures when the velocity of the electrons is in synchronous relationship with the phase velocity of said waves and with waves of another frequency in another of said structures when a similar relationship is present;

a transition region between said structures having a control grid electrode for selectively sorting the desired frequency determining components remaining in the space charge of the beam after traversal of the first frequency wave conducting structure to excite oscillations in succeeding structures;

and a plurality of output transmission lines, each coupled to a different one of said structures for providing different frequencies to loads coupled thereto.

3. An electron discharge device according to claim 2 wherein said sole electrodes are biased at a negative potential relative to said wave conducting structures.

4. An electron discharge device according to claim 2 wherein said sole electrode adjacent said election beam producing means is biased at a positive potential relative to said opposing wave conducting structure.

5. An electron discharge device of the type including a plurality of separate wave conducting structures for conducting waves whose fields interact with electrons from the same electron source comprising:

means for producing a beam of electrons;

a first wave conducting structure for conducting waves of a first frequency;

a second wave conducting structure for conducting waves of a second frequency;

means for producing crossed electric and magnetic fields for compelling said beam to move adjacent said first and second structures generating first and second frequency waves therein and synchronized with a backward wave mode of said first and second frequency waves;

control means intermediate said first and second structures for selectively sorting the desired frequency determining components remaining in the space charge of the beam after traversal of the first frequency wave conducting structure to excite oscillations in the second said structure;

and outputs coupled to said first and second wave conducting structures responsive to said first and second frequencies.

References Cited by the Examiner

UNITED STATES PATENTS

| | | | |
|---|---|---|---|
| 2,753,481 | 7/1956 | Ettenberg | 315—3.6 |
| 2,794,936 | 6/1957 | Huber | 331—82 X |
| 2,916,658 | 12/1959 | Currie | 331—82 X |
| 3,054,017 | 9/1962 | Putz | 315—3.6 |

FOREIGN PATENTS

| | | |
|---|---|---|
| 153,551 | 10/1953 | Australia. |
| 875,263 | 8/1961 | Great Britain. |

ROY LAKE, *Primary Examiner.*

JOHN KOMINSKI, *Examiner.*

J. B. MULLINS, *Assistant Examiner.*